(12) United States Patent
Choi et al.

(10) Patent No.: US 12,219,761 B2
(45) Date of Patent: Feb. 4, 2025

(54) MEMORY DEVICE AND MANUFACTURING METHOD OF THE MEMORY DEVICE

(71) Applicant: SK hynix Inc., Icheon-si Gyeonggi-do (KR)

(72) Inventors: Won Geun Choi, Icheon-si Gyeonggi-do (KR); Jung Shik Jang, Icheon-si Gyeonggi-do (KR); Jang Won Kim, Icheon-si Gyeonggi-do (KR); Mi Seong Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 530 days.

(21) Appl. No.: 17/399,892

(22) Filed: Aug. 11, 2021

(65) Prior Publication Data

US 2022/0271055 A1    Aug. 25, 2022

(30) Foreign Application Priority Data

Feb. 24, 2021    (KR) .................. 10-2021-0024839

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |
| *H10B 63/00* | (2023.01) |
| *H10B 41/20* | (2023.01) |
| *H10B 99/00* | (2023.01) |

(52) U.S. Cl.
CPC ............ *H10B 43/27* (2023.02); *H10B 41/10* (2023.02); *H10B 41/27* (2023.02); *H10B 43/10* (2023.02); *H10B 63/34* (2023.02); *H10B 41/20* (2023.02); *H10B 99/00* (2023.02)

(58) Field of Classification Search
CPC ........ H10B 43/27; H10B 41/10; H10B 41/27; H10B 43/10; H10B 63/34; H10B 43/20; H10B 63/84; H10B 43/30; H10B 41/50; H10B 41/20; H10B 43/50; H10B 99/00; H01L 21/764; H01L 21/823475; H10N 70/011
See application file for complete search history.

(56) References Cited

U.S. PATENT DOCUMENTS

| | | | |
|---|---|---|---|
| 10,141,329 B2 | 11/2018 | Tsuda et al. | |
| 2016/0148949 A1* | 5/2016 | Jayanti | H01L 29/40114 257/314 |
| 2017/0162596 A1* | 6/2017 | Tsuda | H01L 21/0217 |
| 2018/0277556 A1* | 9/2018 | Kang | H10B 43/10 |

FOREIGN PATENT DOCUMENTS

| | | |
|---|---|---|
| KR | 1020120041334 A | 5/2012 |
| KR | 1020140112827 A | 9/2014 |
| KR | 1020170043420 A | 4/2017 |
| KR | 102061698 B1 | 1/2020 |

* cited by examiner

*Primary Examiner* — Patricia D Valenzuela
(74) *Attorney, Agent, or Firm* — WILLIAM PARK & ASSOCIATES LTD.

(57) ABSTRACT

There are provided a memory device and a manufacturing method of the memory device. The memory device includes: a first gate stack structure and a second gate stack structure, disposed on a substrate; and a slit disposed between the first gate stack structure and the second gate stack structure to electrically isolate the first gate stack structure and the second gate stack structure from each other.

11 Claims, 23 Drawing Sheets

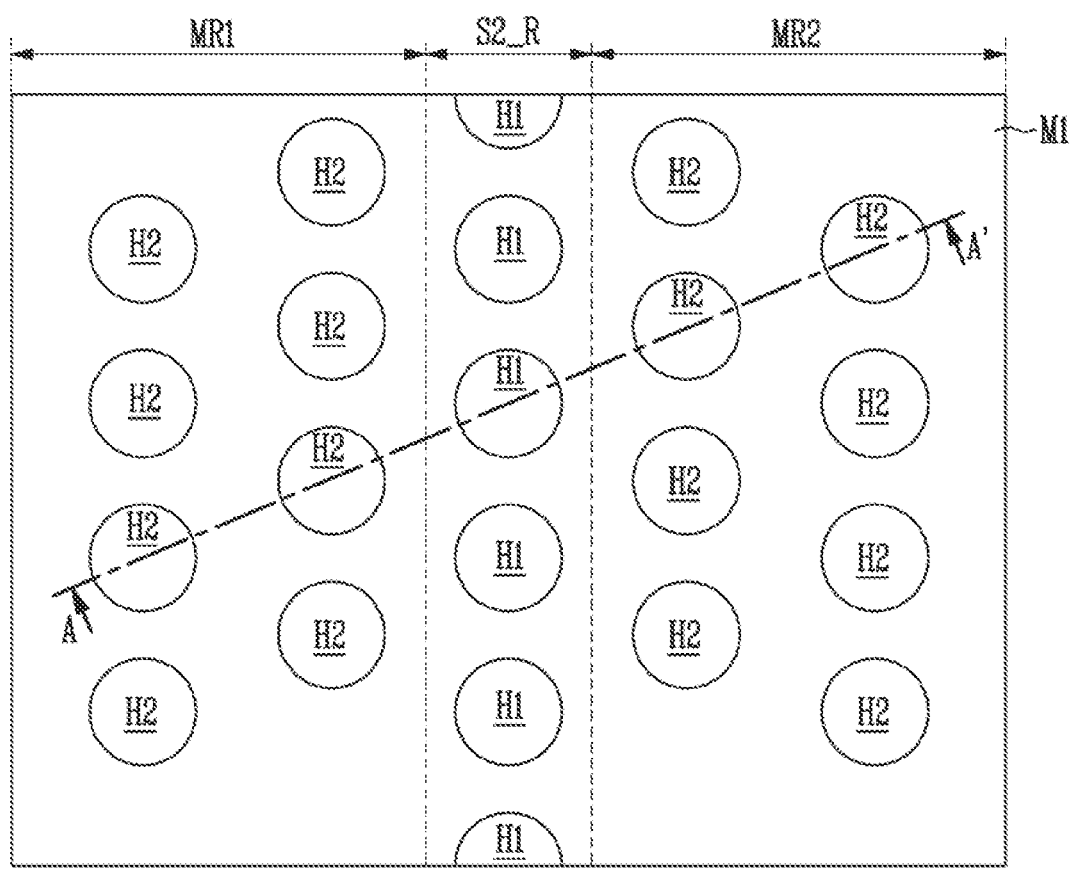

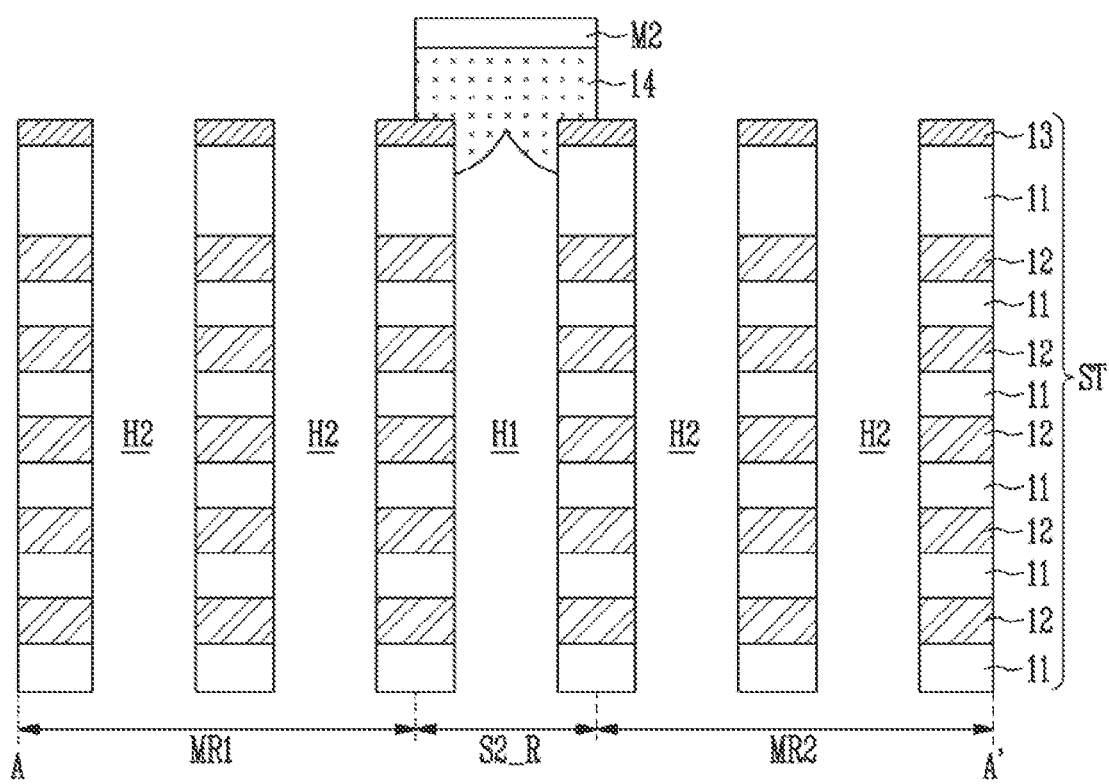

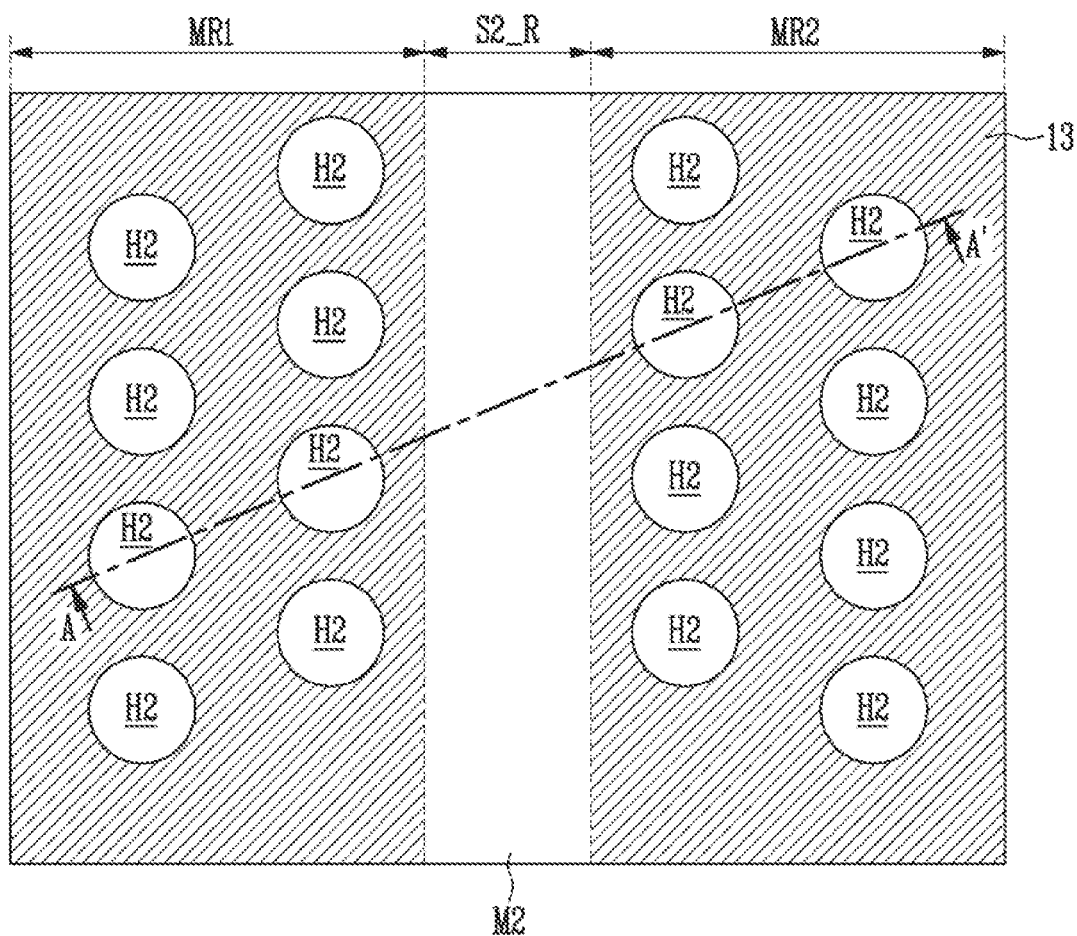

MEMORY DEVICE AND MANUFACTURING METHOD OF THE MEMORY DEVICE

CROSS-REFERENCE TO RELATED APPLICATION

The present application claims priority under 35 U.S.C. § 119(a) to Korean patent application number 10-2021-0024839 filed on Feb. 24, 2021, in the Korean intellectual Property Office, the entire disclosure of which is incorporated by reference herein.

BACKGROUND

1. Technical Field

The present disclosure generally relates to a memory device and a manufacturing method of the memory device, and more particularly, to a three-dimensional memory device and a manufacturing method of the three-dimensional memory device,

2. Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like, The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

As the improvement of the degree of integration of semiconductor devices in which memory cells are formed in the form of a single layer over a substrate reaches the limit, there has recently been proposed a three-dimensional nonvolatile memory device in which memory cells are stacked vertically over a substrate.

The three-dimensional nonvolatile memory device includes interlayer insulating layers and gate electrodes, which are alternately stacked, and channel layers penetrating the interlayer insulating layers and the gate electrodes, and memory cells are stacked along the channel layers. Various structures and manufacturing methods have been developed to improve the operational reliability of such a nonvolatile memory device having a three-dimensional structure and to improve a manufacturing yield.

SUMMARY

In accordance with an aspect of the present disclosure, there may be provided a memory device which may include: a first gate stack structure and a second gate stack structure, disposed on a substrate; and a slit disposed between the first gate stack structure and the second gate stack structure to electrically isolate the first gate stack structure and the second gate stack structure from each other, wherein the slit may have a structure in which a plurality of first holes are connected to each other.

In accordance with another aspect of the present disclosure, there may be provided a method of manufacturing a memory device, the method may include: forming a stack structure by alternately stacking a plurality of interlayer insulating layers and a plurality of sacrificial layers on a substrate including a first memory region, a second memory region, and a slit region between the first memory region and the second memory region; forming a plurality of first holes penetrating the stack structure within the slit region and second holes penetrating the stack structure within the first memory region and the second memory region; forming cell plugs in the second holes; forming plate electrode layers by filling a conductive layer in a space in which the sacrificial layer is removed, after the sacrificial layer exposed through internal sidewalls of the first holes is removed; and electrically isolating the plate electrode layers disposed within the first memory region and the plate electrode layers disposed within the second memory region from each other by etching the plate electrodes exposed through the first holes.

In accordance with still another aspect of the present disclosure, there may be provided a method of manufacturing a memory device, the method may include: forming a stack structure by alternately stacking a plurality of interlayer insulating layers and a plurality of sacrificial layers on a substrate including a first memory region, a second memory region, and a slit region between the first memory region and the second memory region; forming a plurality of holes penetrating the stack structure within the slit region; removing the sacrificial layers through the plurality of holes; forming plate electrode layers by filling a conductive layer in spaces in which the sacrificial layers are removed; and removing the plate electrode layers formed within the slit region through the plurality of holes.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 6, 7A, 7B, 8, 9A, 9B, 10, 11, 12A, 12B, 12C, 13A, and 13B are plan and sectional views illustrating a manufacturing method of a gate stack structure of a memory device in accordance with an embodiment of the present disclosure.

DETAILED DESCRIPTION

Figure 1:
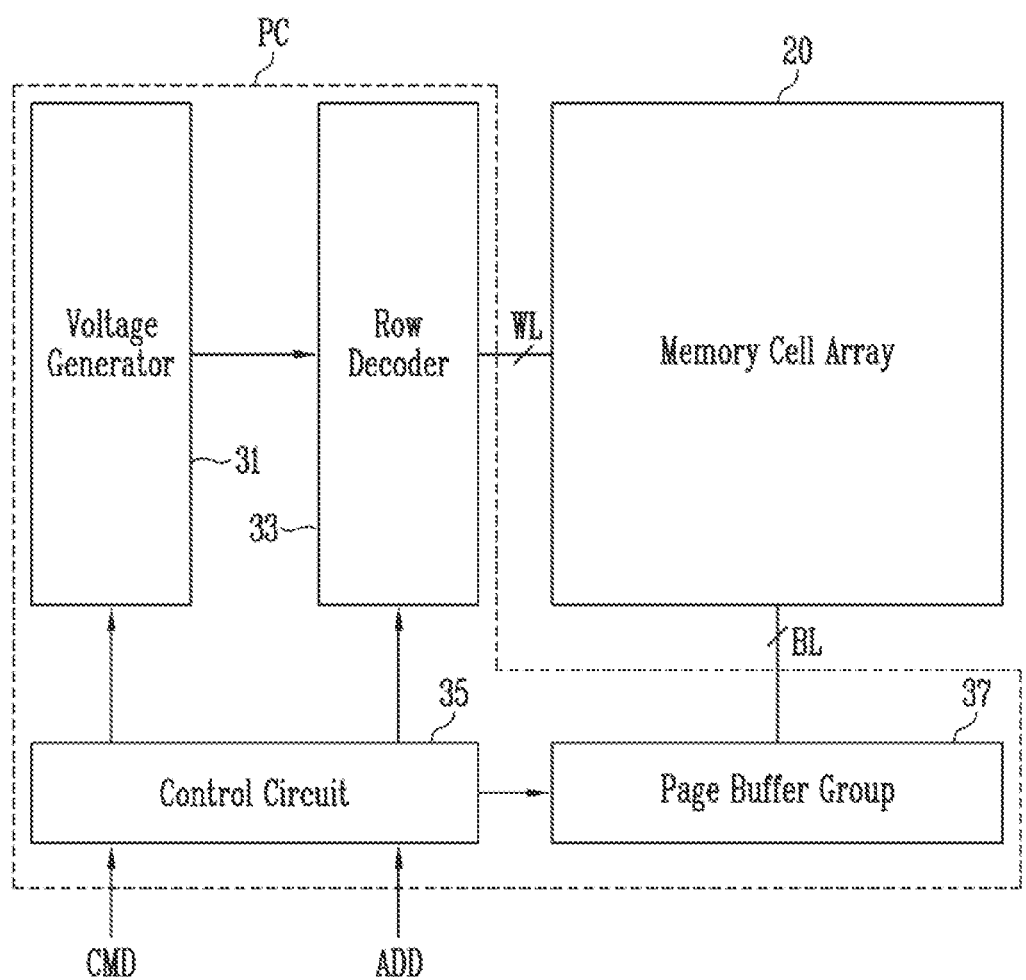
FIG. 1 is a block diagram illustrating a memory device in accordance with an embodiment of the present disclosure.

Hereinafter, examples of embodiments of the present disclosure will be described. In drawings, thicknesses and distances are expressed for convenience of description, and may be exaggerated and illustrated as compared with actual physical thicknesses and distances. In the present specification, a known configuration unrelated to the present disclosure may be omitted. In the specification, when reference numerals are endowed to components in each drawing, it should be noted that like reference numerals denote like elements even though they are depicted in several drawings.

Embodiments provide a memory device having an easy manufacturing process and a stable structure, and a manufacturing method of the memory device.

FIG. 1 is a block diagram illustrating a memory device in accordance with an embodiment of the present disclosure.

Referring to FIG. 1, the memory device 10 may include a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control logic 35, and a page buffer group 37.

The memory cell array 20 may include a plurality of memory blocks, and each of the memory blocks may include a plurality of memory cells in which data is stored. The memory cells may be arranged three-dimensionally.

The memory cell array 20 may be connected to the row decoder 33 through word lines WL, and be connected to the page buffer group 37 through bit lines BL.

The control logic 35 may control the peripheral circuit PC in response to a command CMD and an address ADD.

The voltage generator 31 may generate various operating voltages used for a program operation, a read operation, and an erase operation, under the control of the control logic 35.

The operating voltages may include a program voltage, a verify voltage, a pass voltage, a read voltage, an erase voltage, and the like, The row decoder 33 may provide the memory cell array 20 with the operating voltage generated by the voltage generator sunder the control of the control logic 35. For example, the row decoder 33 may provide the operating voltages generated by the voltage generator 31 to at least one selected memory block among the plurality of memory blocks included in the memory cell array 20.

The page buffer group 37 may be connected to the memory cell array 20 through the bit lines BL. The page buffer group 37 may temporarily store data received from an input/output circuit (not shown) in a program operation under the control of the control logic 35, and control a potential of the bit lines BL, based on the temporarily stored data. The page buffer group 37 may sense a voltage or current of the bit lines BL in a read operation or a verify operation under the control of the control logic 35.

Structurally, the memory cell array 20 may be disposed on the peripheral circuit PC. The memory cell array 20 may overlap with a portion of the peripheral circuit PC.

Figure 2:
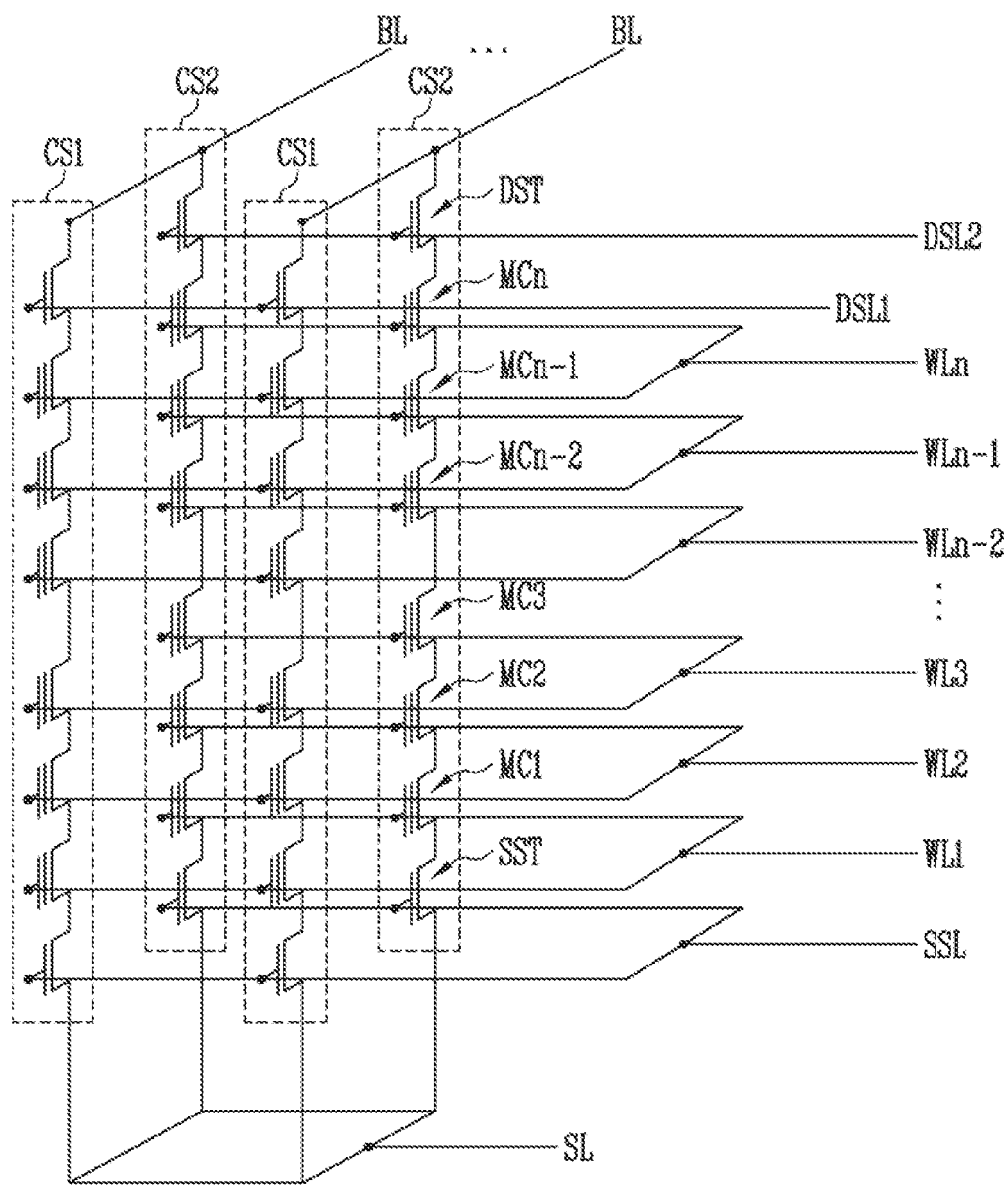
FIG. 2 is a circuit diagram illustrating a memory cell array in accordance with an embodiment of the present disclosure.

FIG. 2 is a circuit diagram illustrating a memory cell array in accordance with an embodiment of the present disclosure.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn stacked to be spaced apart from each other. Two or more drain select lines DSL1 and DSL2 may be spaced apart from each other at the same level.

A gate of the source select transistor SST may be connected to a source select line SSL. A gate of the drain select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same word line and the same bit line may be independently controlled by different drain select lines. Also, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first cell string group connected to the first drain select line DSL1 and a second cell string CS2 of a second cell string group connected to the second drain select line DSL2.

Figure 3:
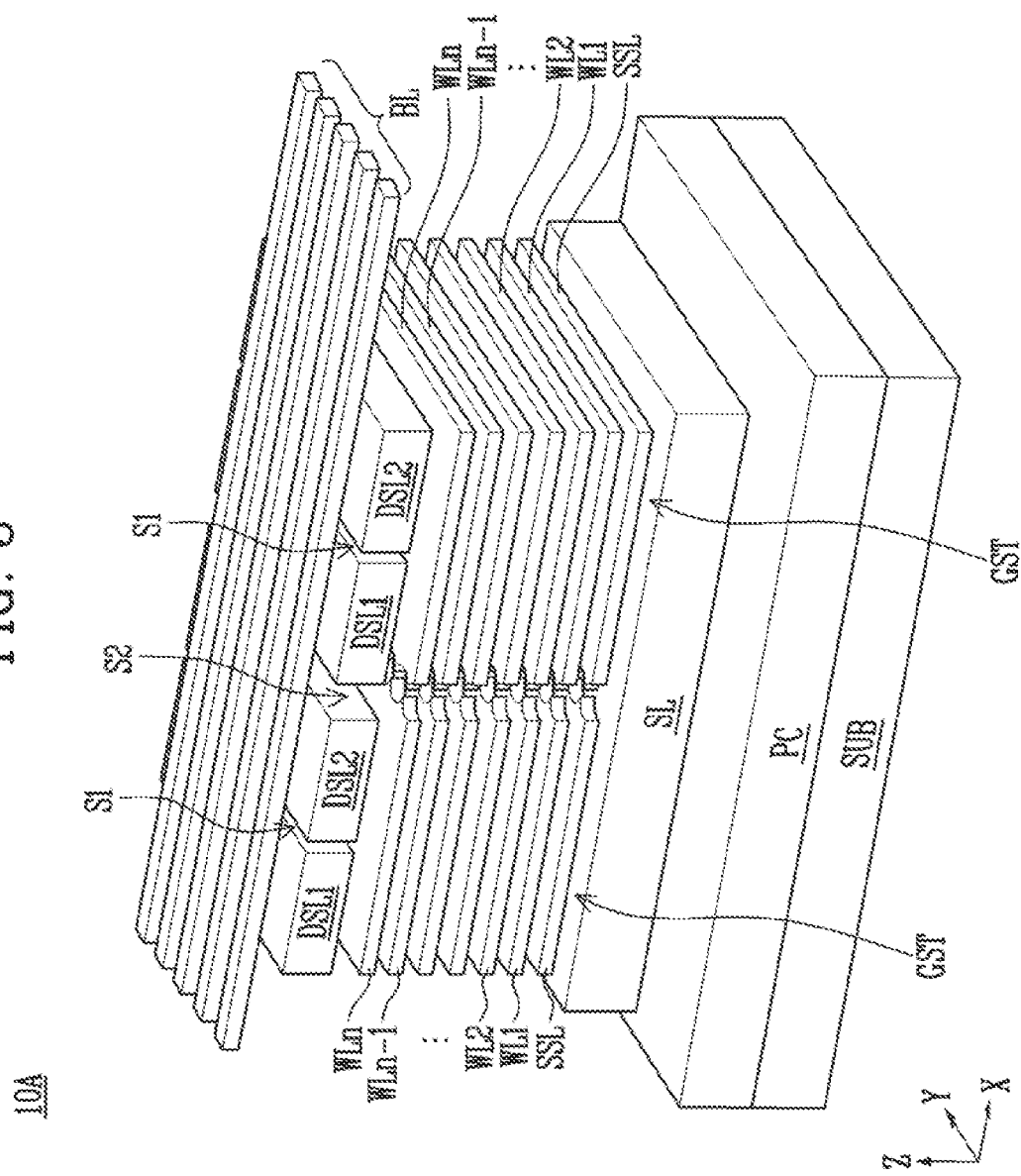
FIGS. 3 and 4 are perspective views illustrating memory devices in accordance with embodiments of the present disclosure.
Figure 4:
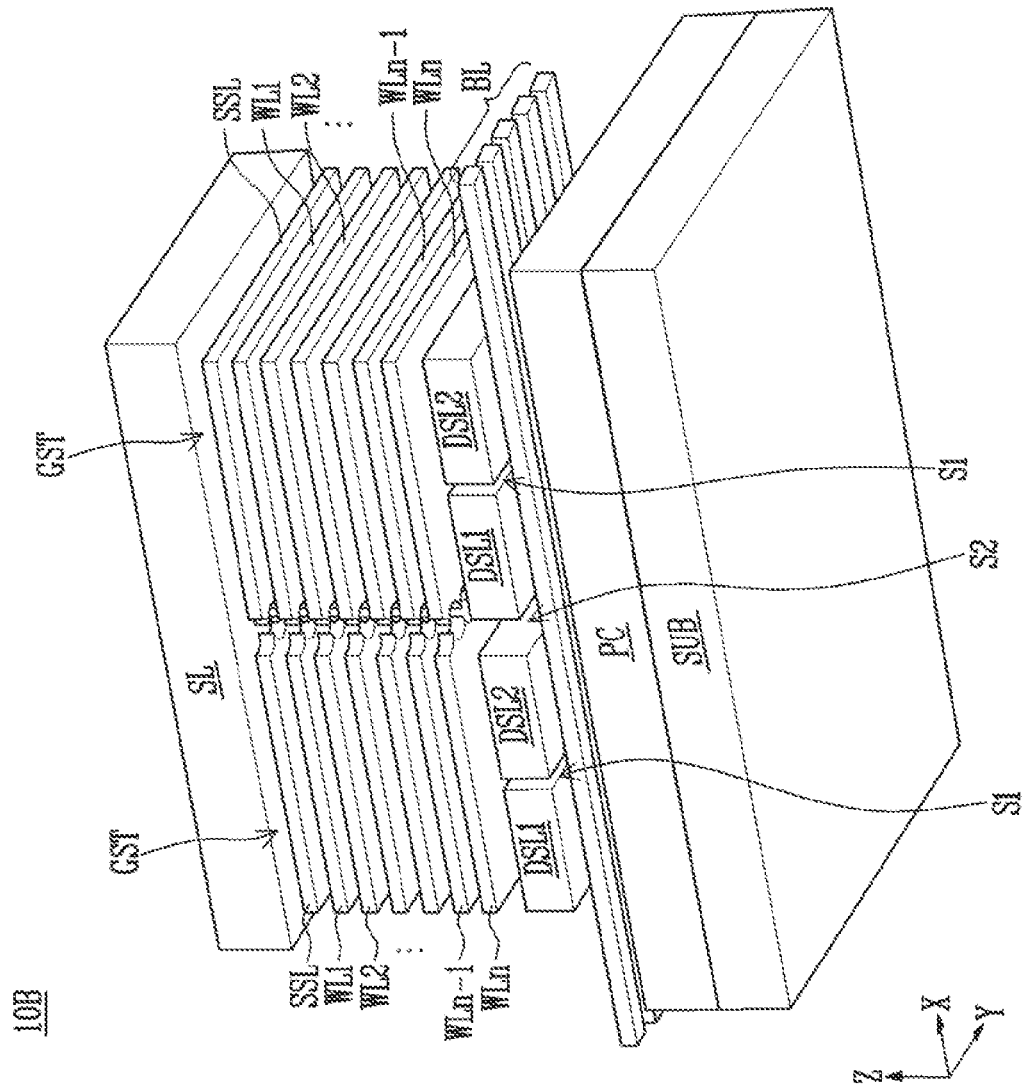

FIGS. 3 and 4 are perspective views illustrating memory devices in accordance with embodiments of the present disclosure.

Referring to FIGS. 3 and 4, each of the memory devices 10A and 10B may include a peripheral circuit PC disposed on a substrate SUB and gate stack structures GST overlapping with the peripheral circuit PC.

Each of the gate stack structures GST may include a source select line SSL, a plurality of word lines WL1 to WLn, and two or more drain select lines DSL1 and DSL2 isolated from each other at the same level by a first slit S1.

The source select line SSL and the plurality of word lines WL1 to WLn may be formed in a plate shape which expands in a first direction X and a second direction Y and is parallel to a top surface of the substrate SUB. The first direction X may be a direction in which an X-axis faces in an XYZ coordinate system, and the second direction Y may be a direction in which a Y-axis faces in the XYZ coordinate system.

The plurality of word lines WL1 to WLn may be stacked to be spaced apart from each other in a third direction Z. The third direction Z may be a direction in which a Z-axis faces in the XYZ coordinate system. The plurality of word lines WL1 to WLn may be disposed between the two or more drain select lines DSL1 and DSL2 and the source select line SSL.

The gate stack structures GST may be isolated from each other by a second slit S2. The first slit S1 may be formed shorter than the second slit S2 in the third direction Z, and overlap with the plurality of word lines WL1 to WLn.

The first slit S1 may extend in a linear shape, extend in a zigzag shape, or extend in a wave form. A width of each of the first slit S1 and the second slit S2 may be variously changed according to a design rule.

In the second slit S2, a plurality of circular holes may be connected to each other to extend in the second direction Y. For example, a plurality of word lines WL1 to WLn of a gate stack structure GST are electrically and physically spaced apart from a plurality of word lines WL1 to WLn of an adjacent gate stack structure GST by the second slit S2.

Although not shown in the drawings, an interlayer insulating layer is formed between a plurality of word lines WL1 to WLn of each of a plurality of gate stack structures GST, to block electrical contact between the plurality of word lines WL1 to WLn.

Referring to FIG. 3, in accordance with an embodiment, the source select line SSL may be disposed closer to the peripheral circuit PC than the two or more drain select lines DSL1 and DSL2.

The memory device 10A may include a source line SL disposed between the gate stack structure GST and the peripheral circuit PC and a plurality of bit lines BL spaced more apart from the peripheral circuit PC than the source line SL. The gate stack structures GST may be disposed between the plurality of bit lines BL and the source line SL.

Referring to FIG. 4, in accordance with an embodiment, the two or more drain select lines DSL1 and DSL2 may be disposed closer to the peripheral circuit PC than the source select line SSL.

The memory device 10B may include a plurality of bit lines BL disposed between the gate stack structures GST and the peripheral circuit PC and a source line SL spaced more apart from the peripheral circuit PC than the plurality of bit lines BL. The gate stack structures GST may be disposed between the plurality of bit lines BL and the source line SL.

Figure 5A:
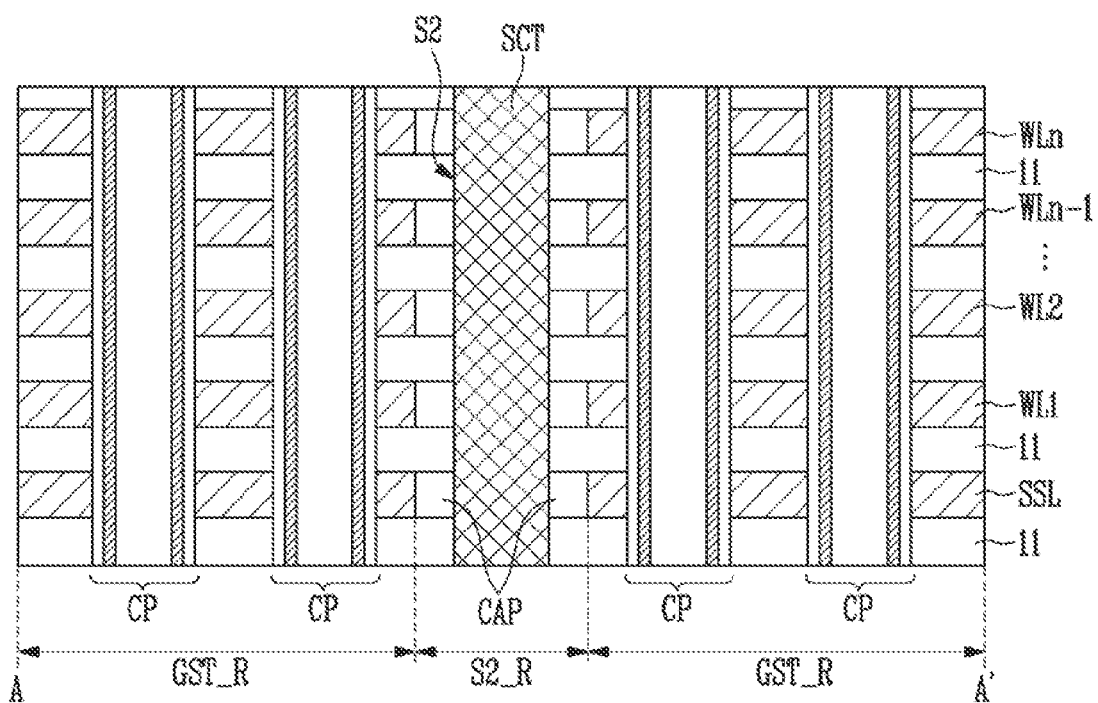
FIGS. 5A and 5B are sectional and plan views illustrating stack structures and a second slit in accordance with an embodiment of the present disclosure.
Figure 5B:
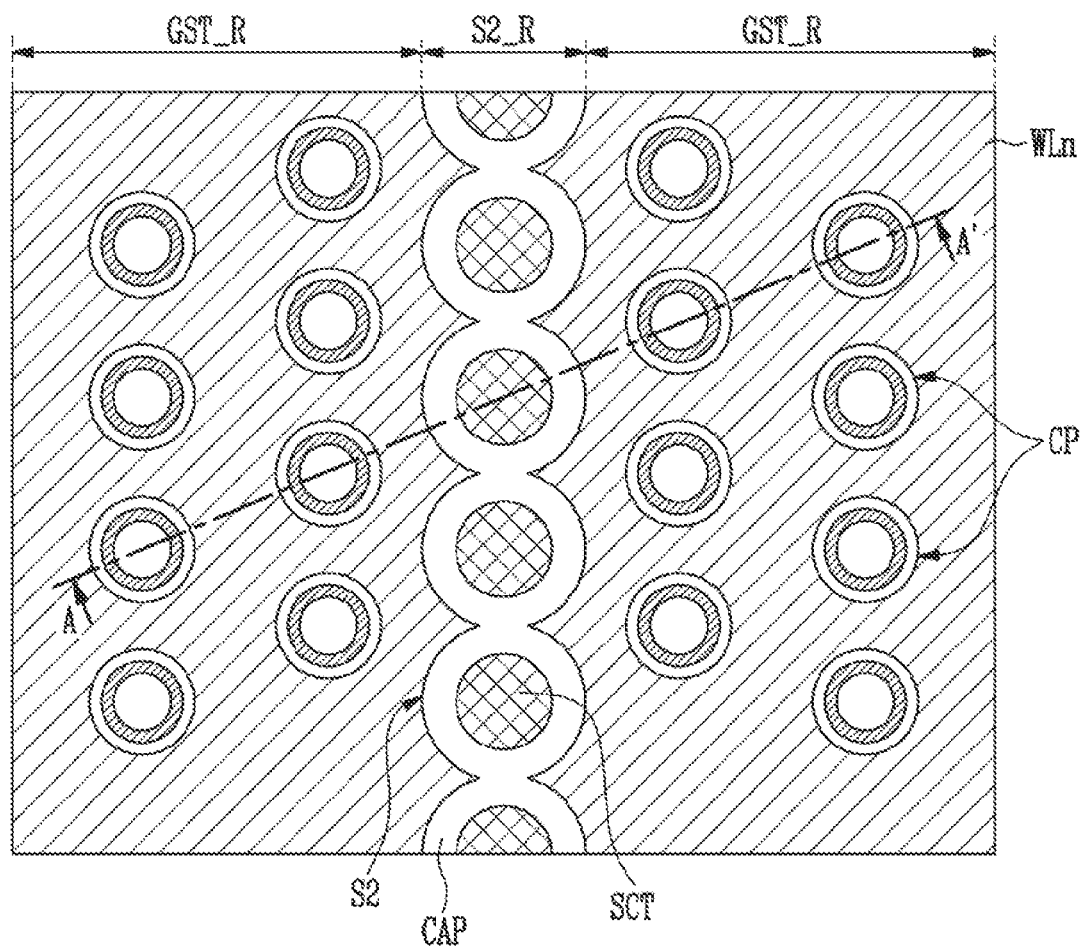

FIGS. 5A and 5B are sectional and plan views illustrating stack structures and a second slit in accordance with an embodiment of the present disclosure.

Referring to FIG. 5A, a stack structure in which a plurality of interlayer insulating layers 11 and a plurality of plate electrodes SSL and WL1 to WLn are alternately stacked is disposed on a stack structure region GST_R. In an embodiment the plate electrodes WL1 to WLn may be used as word lines and the plate electrode SSL may be used as a source select line. In addition, a plurality of cell plugs CP on the stack structure region GST_R penetrate, in a vertical direction, the plurality of interlayer insulating layers 11 and the plurality of plate electrodes SSL and WL1 to WLn. In an embodiment, a plurality of cell plugs CP included in the gate stack structures GST may vertically extend toward the substrate SUB.

A space between two adjacent stack structure regions GST_R may be defined as a second slit region S2_R, and a second slit S2 is formed in the second slit region S2_R.

Each of a plurality of plate electrodes SSL and WL1 to WLn formed in the same layers on the two adjacent stack structure regions GST_R are electrically and physically spaced apart from each other by the second slit S2.

Capping patterns CAP which shield end portions of each of the plurality of plate electrodes SSL and WL1 to WLn and a source line contact SCT connected to the source line (SL shown in FIG. 3) may be formed at the inside of the second slit S2.

Although a case where the source line contact SCT is formed at the inside of the second slit S2 is illustrated and described in the above-described embodiment, the second slit S2 may be filled with an insulating material, so that a plurality of stack structures are spaced apart from each other.

FIG. 5B is a plane view of a layer in which a plate electrode (e.g., WLn) is disposed. Referring to FIG. 5B, in the second slit S2, a plurality of circular holes are connected to each other, so that plate electrodes formed on two stack structure regions GST_R are physically and electrically spaced apart from each other. The source line contact SCT extending in the vertical direction may be formed at the inside of the second slit S2. The capping patterns CAP are formed between end portions of the plate electrodes and the source line contact SCT, to allow the plate electrodes and the source line contact SCT to be physically and electrically spaced apart from each other.

Figure 6:
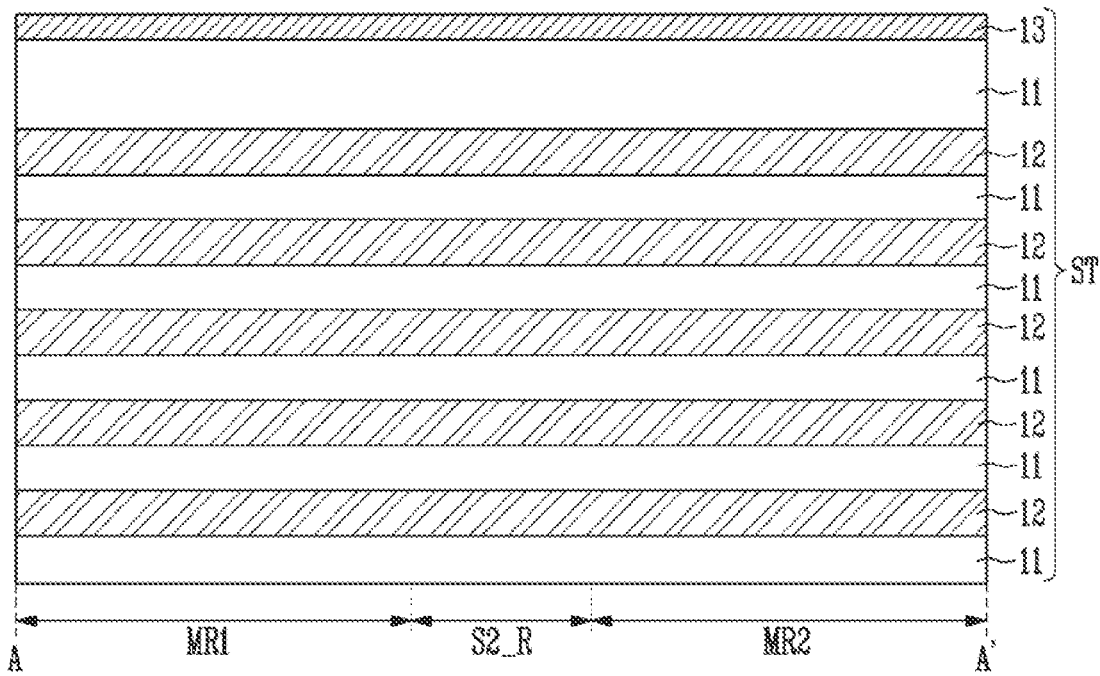

FIGS. 6, 7A, 7B, 8, 9A, 9B, 10, 11, 12A, 12B, 12C, 13A, and 13B are plan and sectional views illustrating a manufacturing method of a gate stack structure of a memory device in accordance with an embodiment of the present disclosure, Referring to FIG. 6, a stack structure ST may be formed, in which interlayer insulating layers 11 and sacrificial layers 12 are alternately stacked. An auxiliary sacrificial layer 13 may be additionally disposed at an uppermost portion of the stack structure ST. For example, the interlayer insulating layers 11 and the sacrificial layers 12 may be alternately stacked, and the auxiliary sacrificial layer 13 may be formed on the top of an interlayer insulating layer 11 disposed at an uppermost portion. The stack structure ST may be formed on a substrate (not shown) including a peripheral circuit. The substrate may include a first memory region MR1, a second slit region S2_R, and a second memory region MR2. The first memory region MR1 and the second memory region MR2 are regions in which the gate stack structures GST shown in FIG. 3 or 4 are formed, and the second slit region S2_R is a region in which the second slit S2 shown in FIG. 3 or 4 is formed. For example, FIG. 3 illustrates a first gate stack structure GST electrically isolated from a second gate stack structure GST by the second slit S2. For example, FIG. 4 illustrates a first gate stack structure GST electrically isolated from a second gate stack structure GST by the second slit S2.

The sacrificial layers 12 may be formed of a material different from that of the interlayer insulating layers 11. For example, the interlayer insulating layers 11 may be formed of oxide such as a silicon oxide layer. The sacrificial layers 12 may be formed of a material having an etching rate different from that of the interlayer insulating layers 11. For example, the sacrificial layers 12 may be formed of nitride such as a silicon nitride layer.

In an embodiment of the present disclosure, it has been illustrated and described that the interlayer insulating layers 11 and the sacrificial layers 12 are alternately stacked, and the interlayer insulating layer 11 is disposed in an uppermost layer. However, in another embodiment, a sacrificial layer or an insulating layer may be formed in the uppermost layer.

Figure 7A:
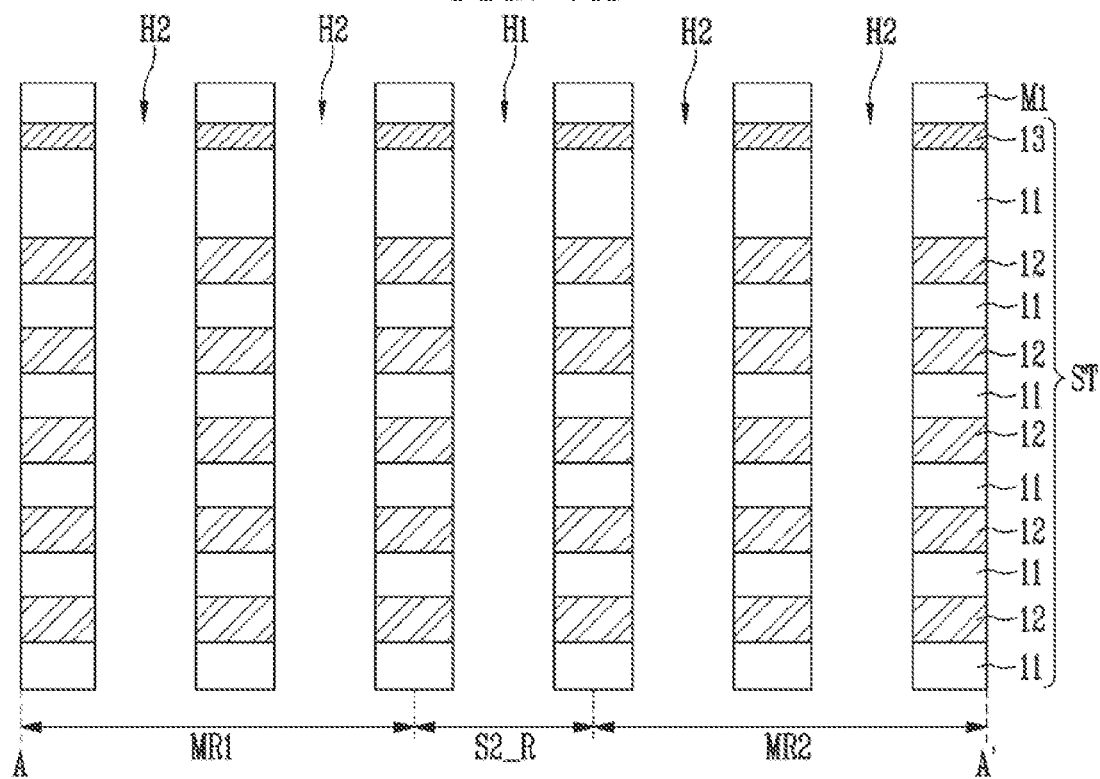

Referring to FIGS. 7A and 7B, a first mask pattern M1 is formed on the stack structure ST, and first holes H1 and second holes H2, which penetrate the stack structure ST, are formed by performing an etching process, using the first mask pattern M1.

The first holes H1 may penetrate the stack structure ST disposed within the second slit region S2_R between the first memory region MR1 and the second memory region MR2, and be disposed in a line to be spaced apart from each other at a certain distance in second direction Y.

Figure 8:
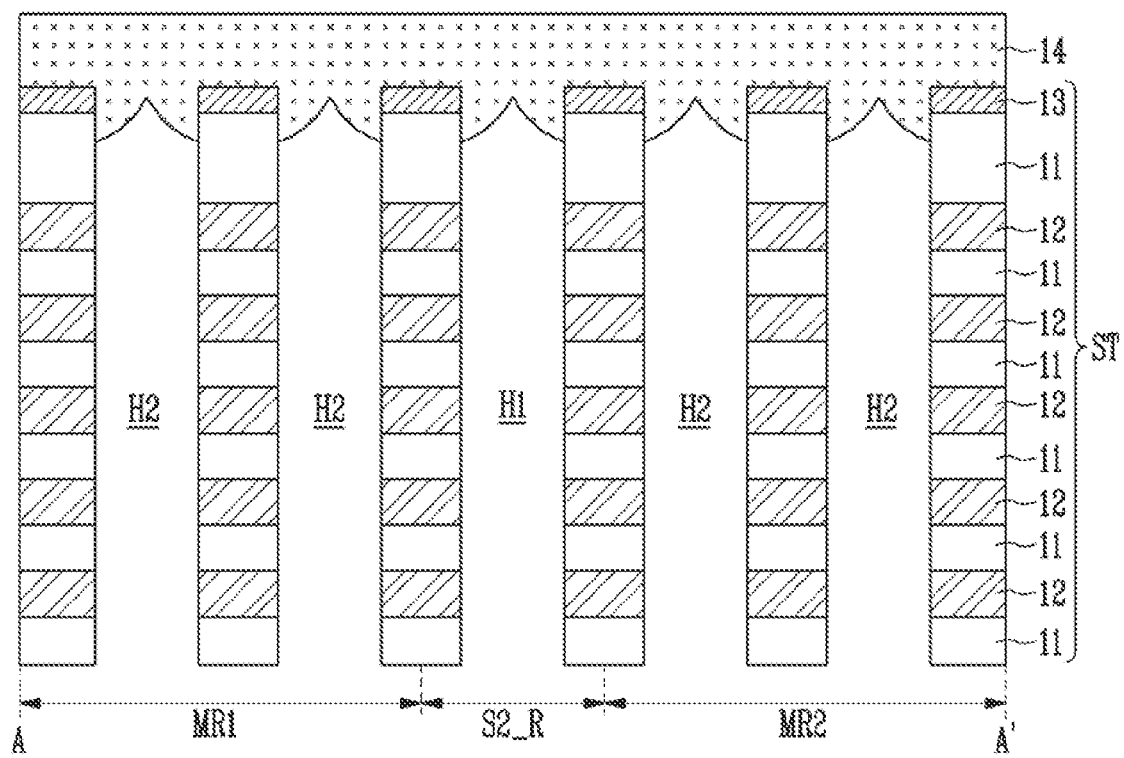

The first holes H1 and the second holes H2 may be formed to have threshold numerical values with sizes similar to each other, Referring to FIG. 8, after the first mask pattern M1 is removed, a mask layer 14 is formed on the top of the entire structure of the stack structure ST in which the first holes H1 and the second holes H2 are formed. The first holes H1 and the second holes H2 may be formed such that the mask layer 14 is not buried in the first holes H1 and the second holes H2. For example, the mask layer 14 is formed on the top of the stack structure ST, and the first holes H1 and the second holes H2 may be formed such that the mask layer 14 is not buried in the first holes H1 and the second holes H2 since overhang caused by the mask layer 14 is generated in uppermost openings of the first holes H1 and the second holes H2. The mask layer 14 may be formed as an oxide layer.

Referring to FIGS. 9A and 9B, a second mask pattern M2 by which the first memory region MR1 and the second memory region MR2 are opened is formed on the mask layer 14. Subsequently, the second holes H2 formed in the first memory region MR1 and the second memory region MR2 are exposed by patterning the mask layer 14 through an etching process using the second mask pattern M2. The first holes H1 formed in the second slit region S2_R is in a state in which the openings of the first holes H1 are blocked by the patterned mask layer 14. In an embodiment, the second mask pattern M2 may shield openings of the first holes H1 on the top of the stack structure within the second slit region S2_R, before the forming of the cell plugs CP in the second holes H2.

Figure 10:
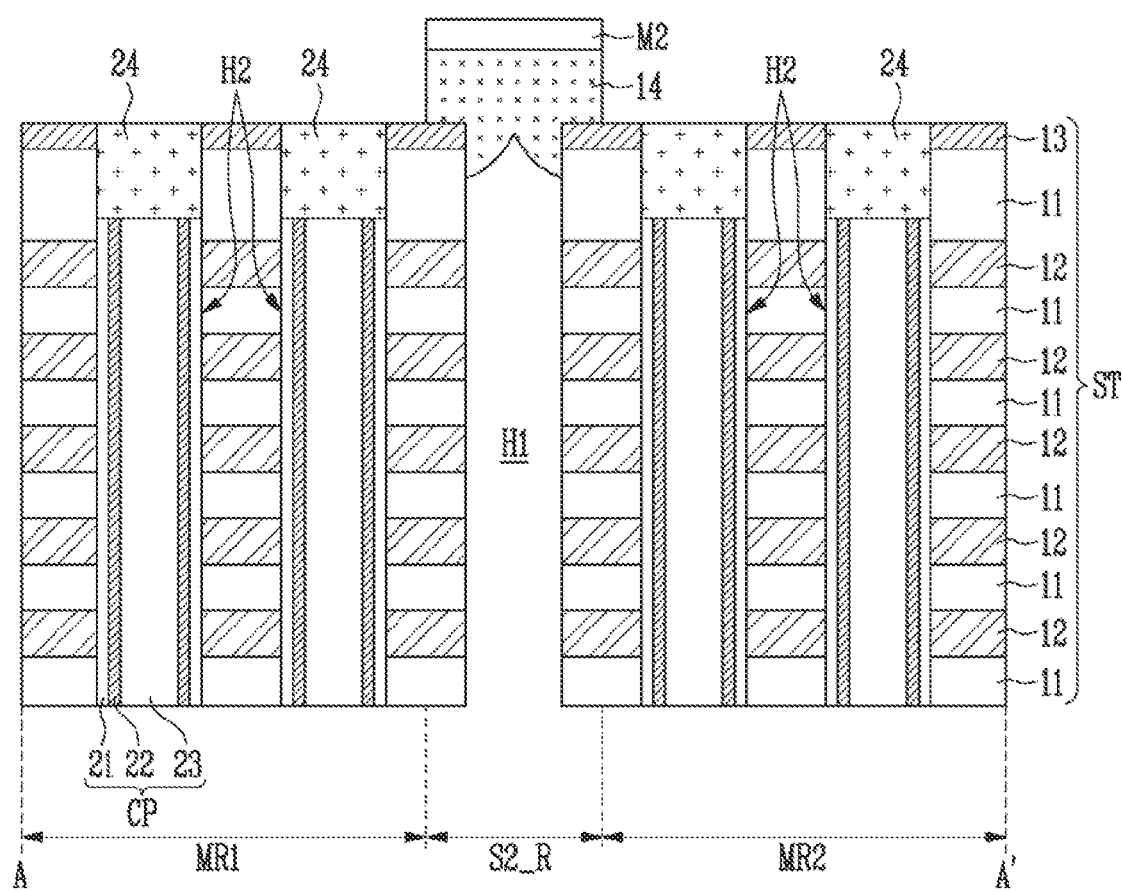

Referring to FIG. 10, cell plugs CP are formed at the inside of the second holes H2 formed in the first memory region MR1 and the second memory region MR2. The cell plugs CP may be formed by sequentially stacking a memory layer 21, a channel layer 22, and a core insulating layer 23 on sidewalls of the second holes H2.

The memory layer 21 may be formed as a multi-layer. For example, the memory layer 21 may include a blocking insulating layer, a charge storage layer, and a tunnel insulating layer. The blocking insulating layer may be formed on the sidewall of the second hole H2. The blocking insulating layer may include an oxide layer capable of blocking charges. In an embodiment, the blocking insulating layer may be formed of $Al_2O_3$. The charge storage layer may be formed on a sidewall of the blocking insulating layer. The charge storage layer may be formed as a charge trap layer, be formed as a material layer including a conductive nano dot, or be formed as a phase change material layer. For example, the charge storage layer may store data changed using Fowler-Nordheim tunneling. To this end, the charge storage layer may be formed as a silicon nitride layer in which charges can be trapped. The tunnel insulating layer may be formed on a sidewall of the charge storage layer. The tunnel insulating layer may be formed as a silicon oxide layer through which charges can tunnel.

The channel layer 22 may include a semiconductor layer. In an embodiment, the channel layer 22 may include silicon.

The core insulating layer 23 may be formed to fill central regions of the second holes H2. The core insulating layer 23 may be formed as an oxide layer.

Subsequently, uppermost portions of the cell plugs CP are removed by etching the cell plugs CP to a certain thickness, and a contact plug pattern 24 may be formed in spaces in which the cell plugs CP are removed. The contact plug pattern 24 may be formed as a doped semiconductor layer.

Figure 11:
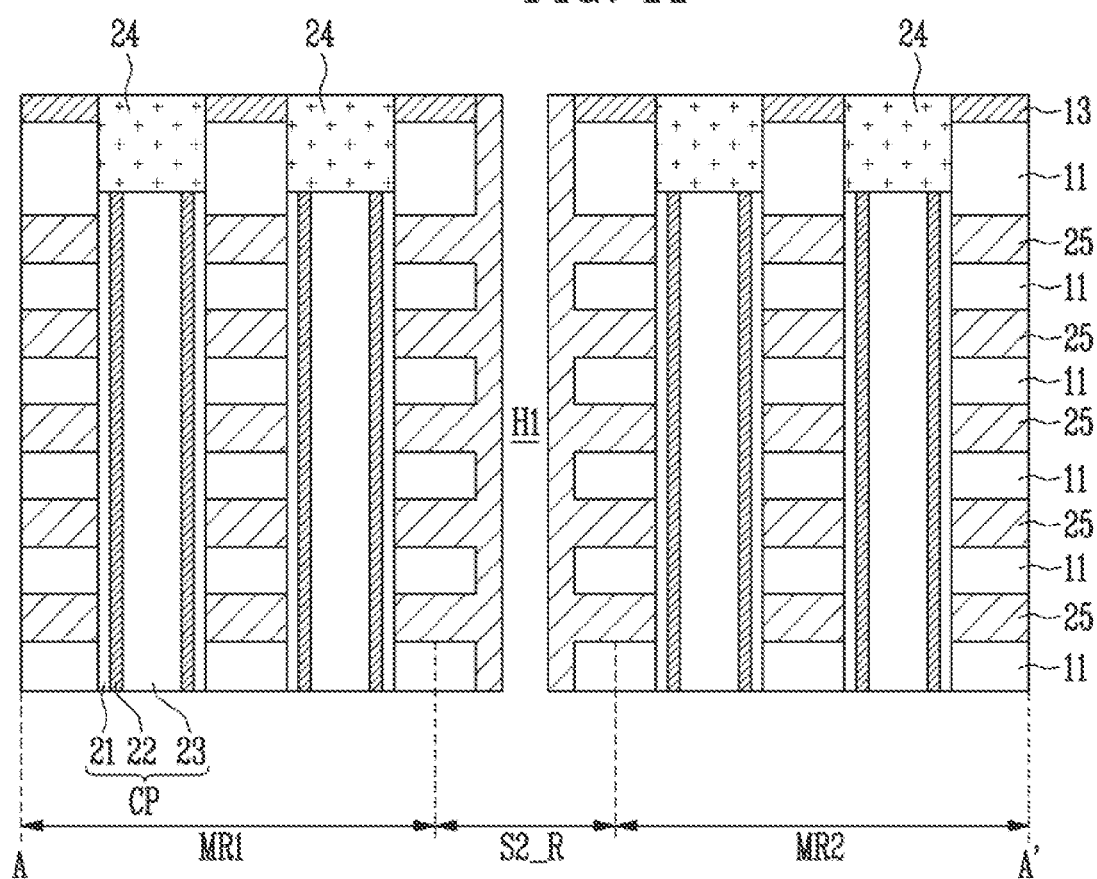

Referring to FIG. 11, the first holes H1 are exposed by removing the second mask pattern and the mask layer, which are disposed within the second slit region S2_R.

Subsequently, the sacrificial layers are removed through the exposed first holes H1. Subsequently, plate electrodes 25 are formed by filling, with a conductive material, spaces in which the sacrificial layers are removed.

Figure 12A:
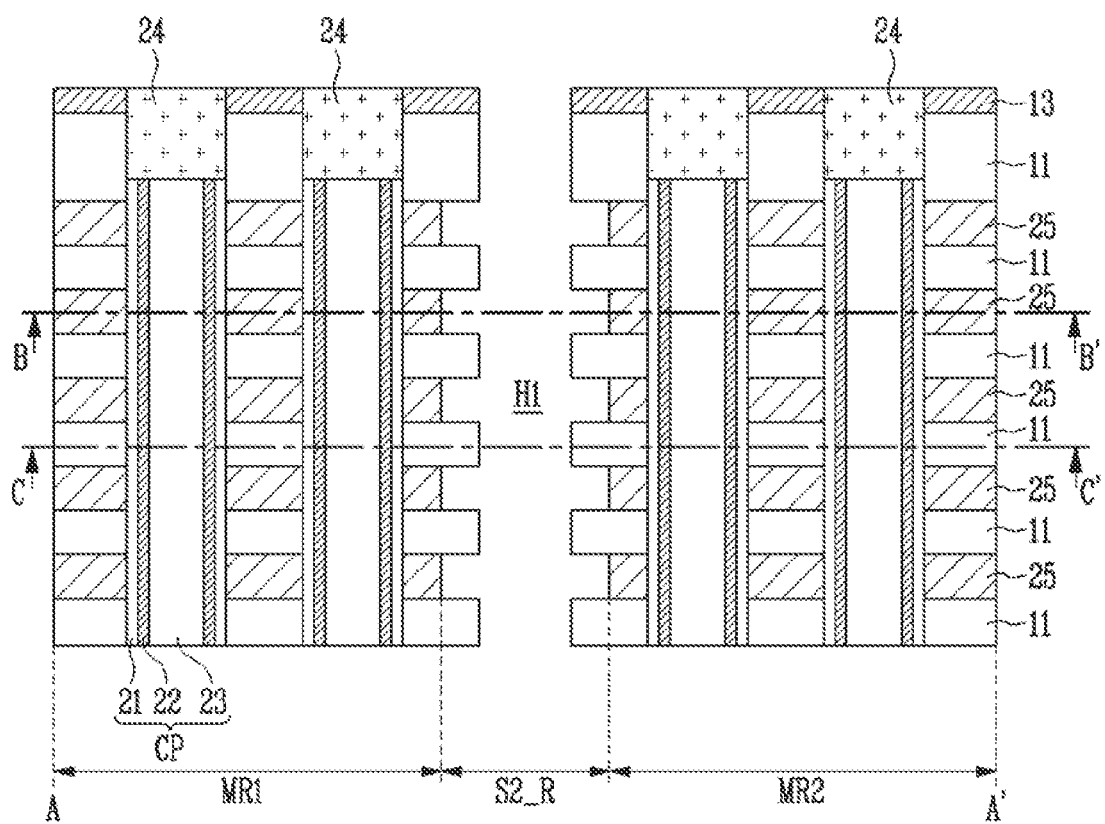

Referring to FIG. 12A, plate electrodes 25 formed within the first memory region MR1 and plate electrodes 25 formed within the second memory region MR2 are physically and electrically spaced apart from each other by etching the plate electrodes 25 formed at the inside of the first holes H1 to a certain thickness through an etching process. That is, the plate electrodes 25 formed within the second slit region S2_R are removed by using a wet etching process, so that the plate electrodes 25 formed within the first memory region MR1 and the plate electrodes 25 formed within the second memory region MR2 are physically and electrically spaced apart from each other.

Figure 12B:
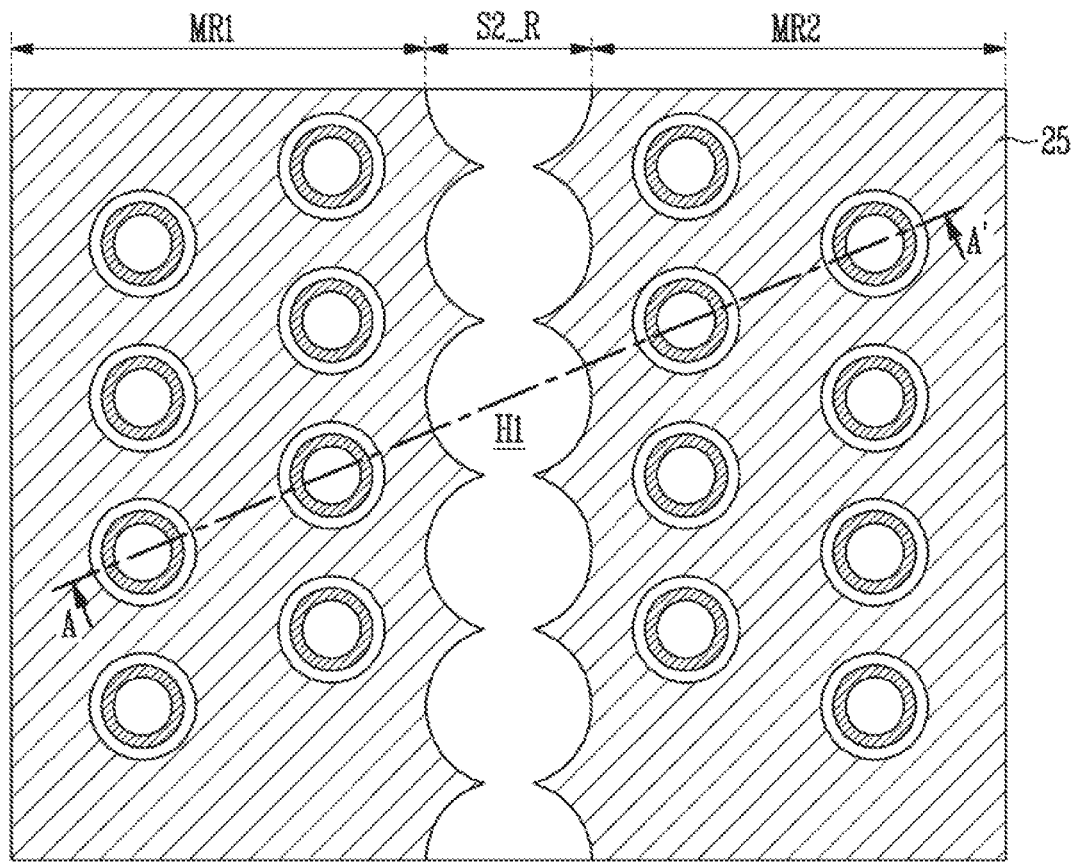

FIG. 12B is a plan view of a layer (B-B') in which the plate electrode shown in FIG. 12A is disposed. Referring to FIG. 12B, the first holes formed within the second slit region S2_R are connected to each other by etching the plate electrodes 25 formed at the inside of the first holes H1 to a certain thickness, so that the plate electrodes 25 formed within the first memory region MR1 and the plate electrodes 25 formed within the second memory region MR2 are physically and electrically spaced apart from each other. In addition, one end portions of the plate electrodes 25 formed within the first memory region MR1, which are adjacent to the second slit region S2_R, have a wave pattern due to the first holes H1. One end portions of the plate electrodes 25 formed within the second memory region MR2, which are adjacent to the second slit region S2_R, have a wave pattern due to the first holes H1. The one end portions of the plate electrodes 25 formed within the first memory region MR1 and the one end portions of the plate electrodes 25 formed within the second memory regionMR2 have wave patterns which face each other and are symmetrical to each other.

The first holes H1 connected to each other, which are formed within the second slit region S2_R, may be defined as the second slit S2 shown in FIG. 3 or 4. The second slit in accordance with an embodiment of the present disclosure may have a structure in which a plurality of first holes disposed in a line are connected to each other, and a surface of the second slit, which is adjacent to the first memory region MR1, and a surface of the second slit, which is adjacent to the second memory region MR2, may have wave patterns which are symmetrical to each other.

Figure 12C:
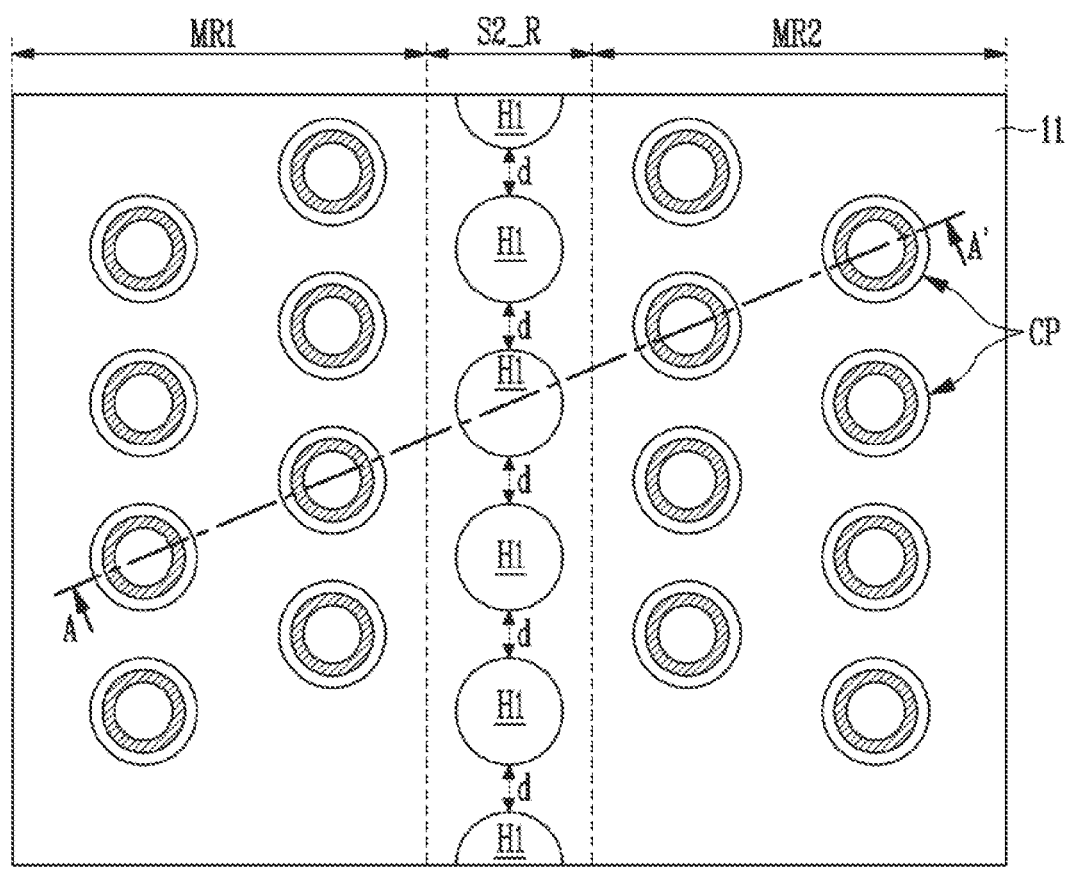

FIG. 12C is a plan view of a layer (C-C') in which the interlayer insulating layer shown in FIG. 12A is disposed. Referring to FIG. 12C, the interlayer insulating layers 11 formed within the second slit region S2_R are not etched in a process of etching the above-described plate electrodes 25 to a certain thickness, and therefore, the first holes H1 penetrating the interlayer insulating layers 11 may be disposed in a line to be spaced apart from each other at a certain distance d. That is, the interlayer insulating layers 11 disposed within the first and second memory regions MR1 and MR2 are disposed to extend onto the second slit region S2_R, and the interlayer insulating layers 11 disposed to extend onto the second slit region S2_R are penetrated by the first holes H1. In an embodiment, from a plan view as shown in FIG. 12C, the first holes may have a round shape, a circular shape, an oval shape, or the like. In an embodiment, from a plan view as shown in FIG. 12C, the first holes may have a shape different from a round shape, a circular shape, an oval shape, or the like.

Figure 13A:
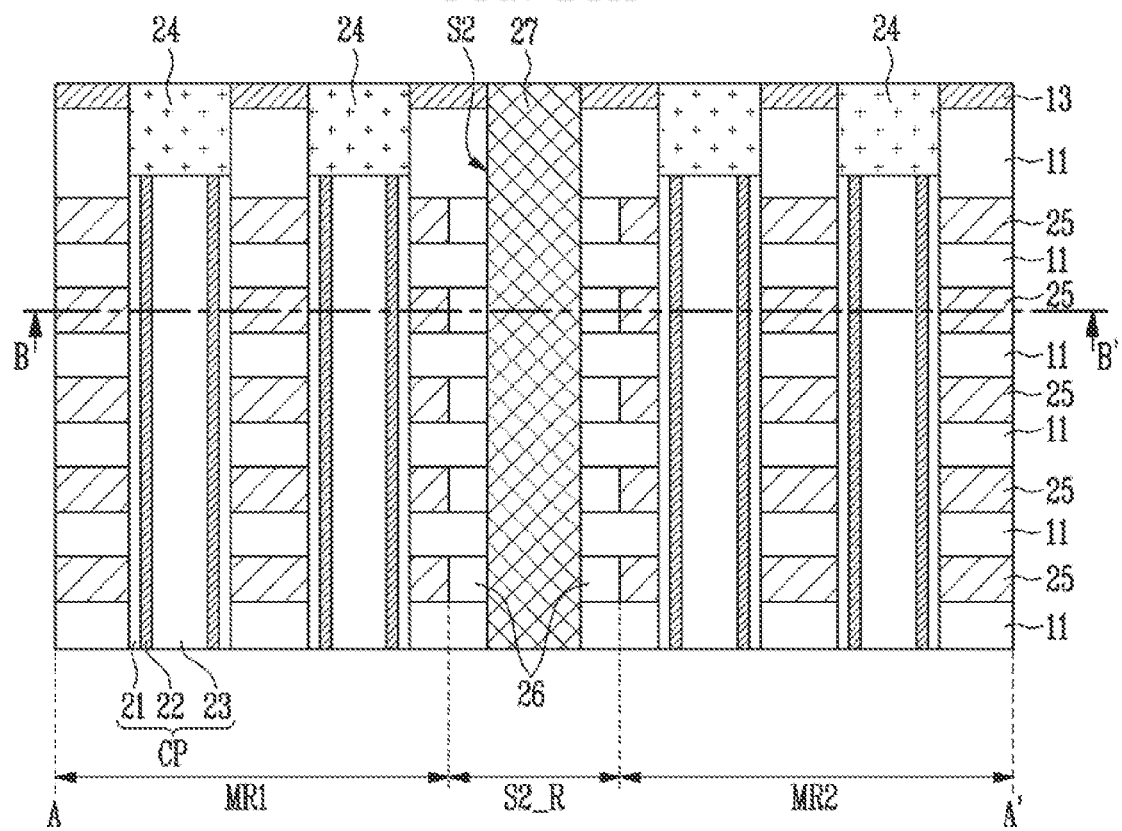
Figure 13B:
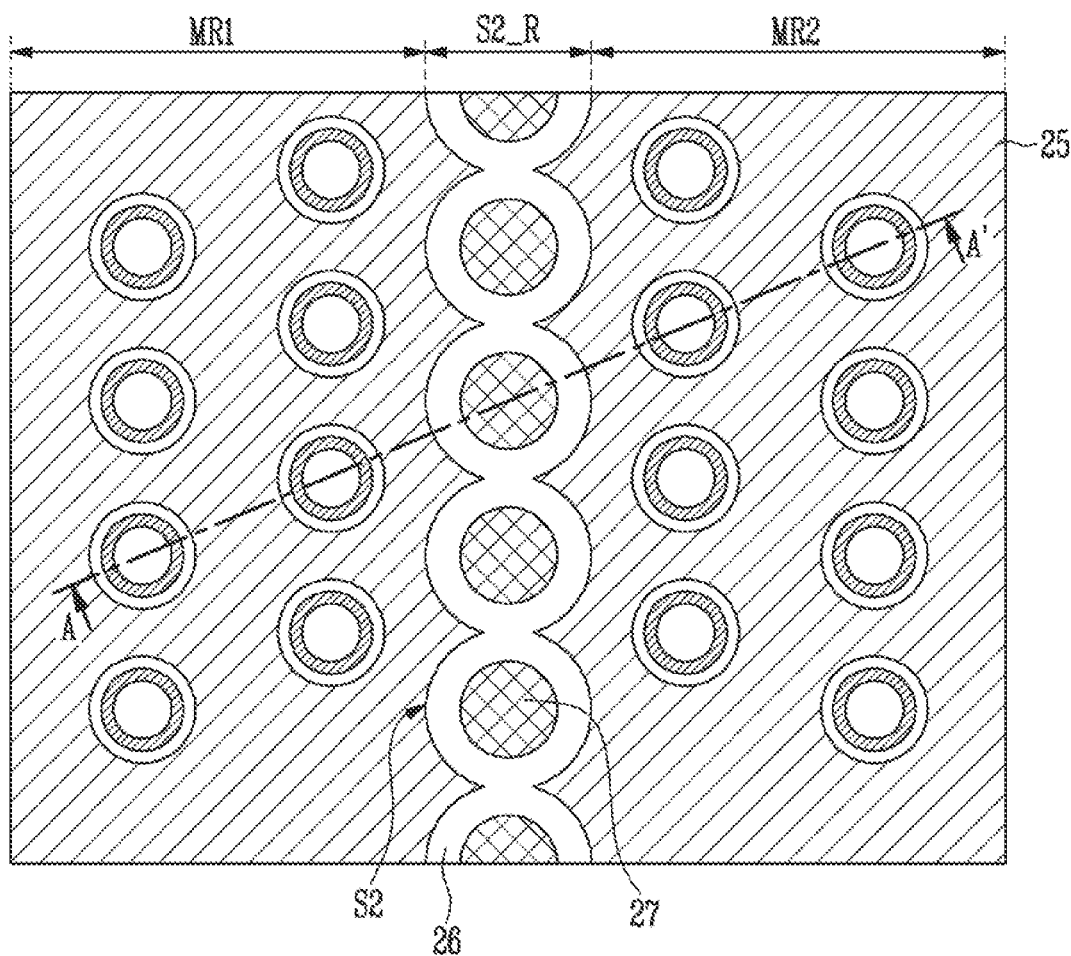

Referring to FIGS. 13A and 13B, a capping pattern 26 may be formed to shield sidewalk of the plate electrodes 25 exposed by the second slit S2. The capping pattern 26 may be formed by oxidizing portions of the exposed plate electrodes 25. Alternatively, the capping pattern 26 may be formed by filling, with an insulating material, empty spaces formed by etching the plate electrodes 25 to a certain thickness.

Subsequently, a source line contact 27 may be formed at the inside of the second slit S2. The source line contact 27 may be formed as a poly-silicon layer or a tungsten layer.

In the above-described embodiment, a case where the source line contact 27 is formed at the inside of the second slit S2 is illustrated and described as an example. However, the second slit S2 may be filled with an insulating material instead of the source line contact SCT.

In accordance with an embodiment of the present disclosure, the second holes for forming the cell plugs and the first holes for forming the second slit are formed together through one process, so that a manufacturing process can be simplified. In addition, the first holes having the same size as the second holes are formed to form the second slit, so that reduction in size of the second holes disposed in a region adjacent to the second slit can be minimized.

Figure 14A:
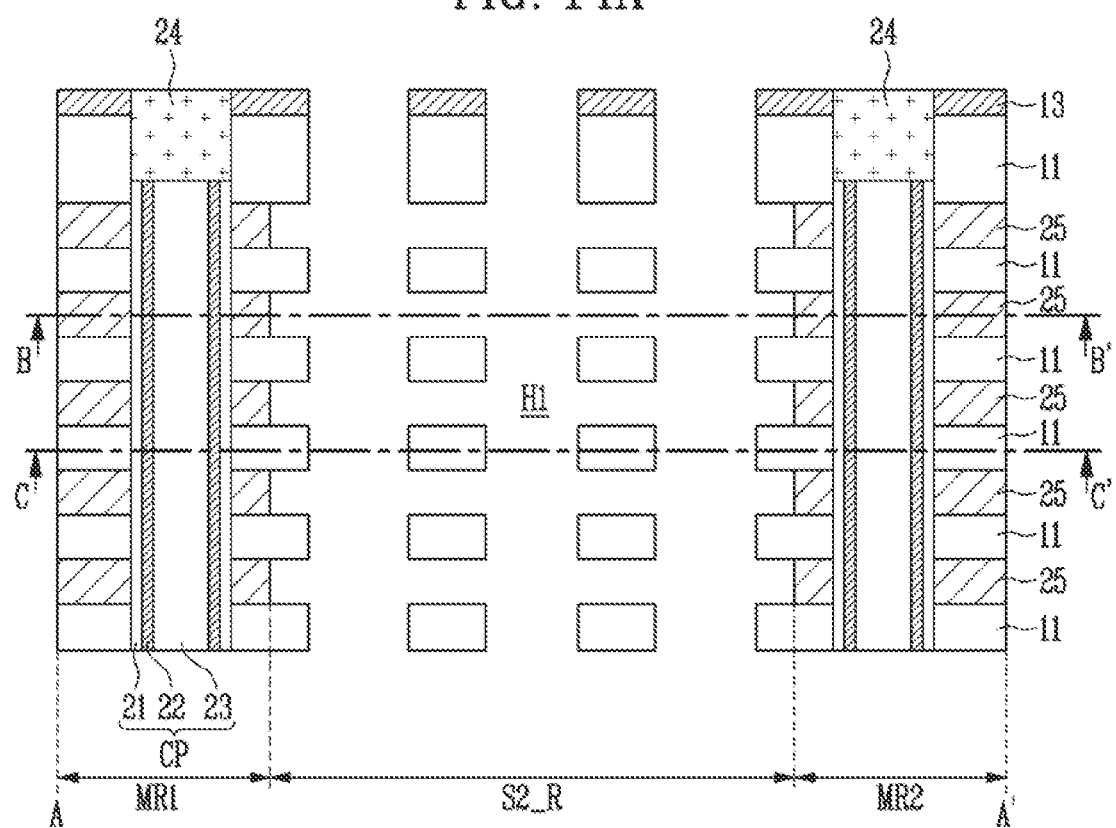
FIGS. 14A, 14B, and 14C are plan and sectional views illustrating a structure of a gate stack structure in accordance with another embodiment of the present disclosure.
Figure 14B:
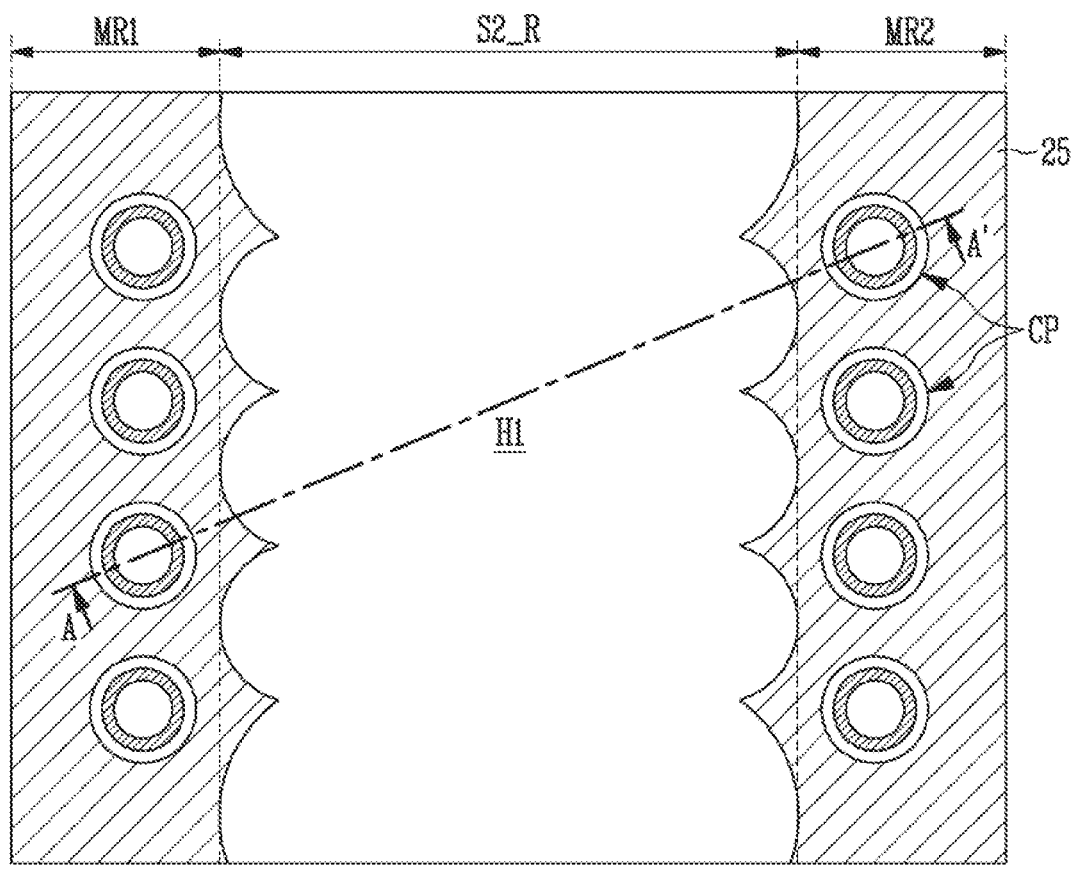
Figure 14C:
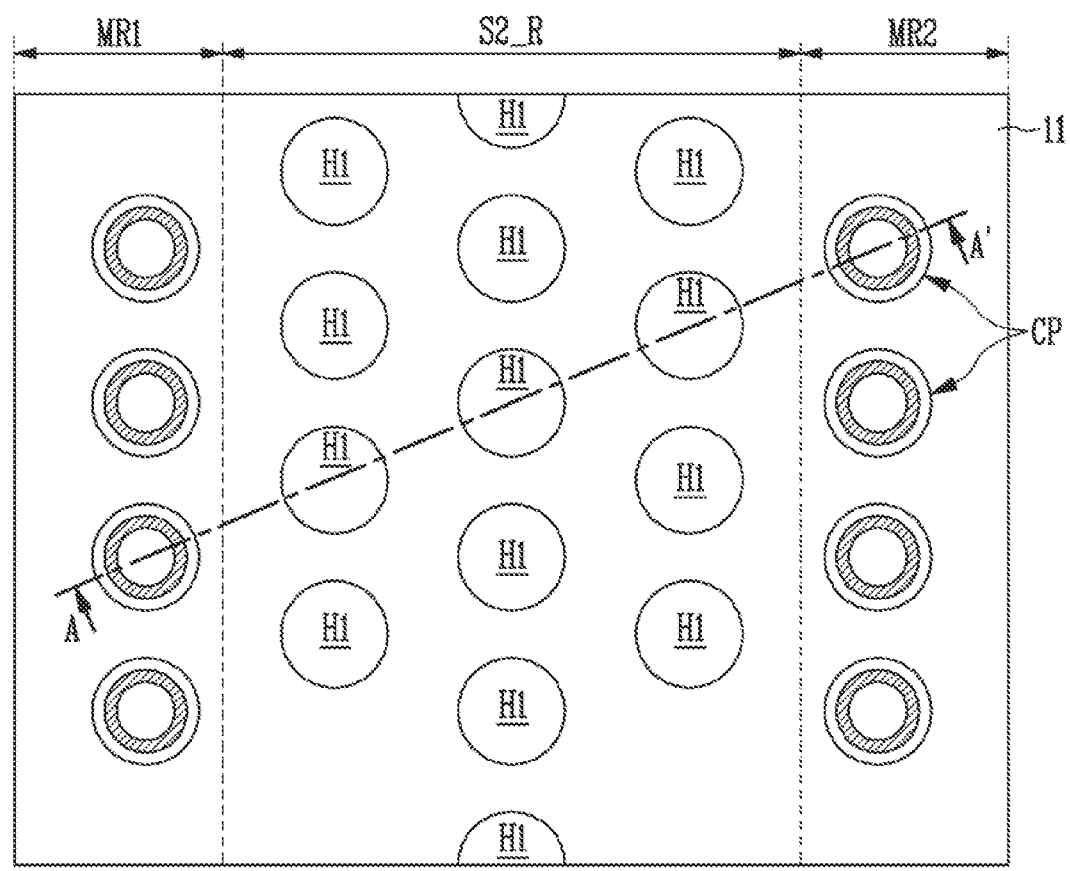

FIGS. 14A, 14B, and 14C are plan and sectional views illustrating a structure of a gate stack structure in accordance with another embodiment of the present disclosure.

In the above-described embodiment of the present disclosure, which is shown in FIGS. 12A, 12B, and 12C, it has been described that a plurality of first holes H1 are disposed in a line in the second slit region S2_R. In the another embodiment of the present disclosure, a plurality of first holes H1 may be disposed in a plurality of lines in the second slit region S2_R. In an embodiment, a plurality of first holes H1 may be arranged in a zigzag shape as shown in FIG. 14C.

Referring to FIG. 14A, a plurality of first holes H1 may be arranged in at least two lines in an A-A' direction in the second slit region S2_R between the first memory region MR1 and the second memory region MR2. The plate electrodes 25 disposed in the first memory region MR1 and the second memory region MR are electrically and physically spaced apart from each other by using a wet process through the plurality of first holes H1 arranged in the second slit region S2_R.

FIG. 14B is a plan view of a layer (B-B') in which the plate electrode shown in FIG. 14A is disposed. Referring to FIG. 14B, the first holes H1 formed within the second slit region S2_R are connected to each other by etching the plate electrodes 25 formed at the inside of the first holes H1 to a certain thickness, so that plate electrodes 25 formed within the first memory region MR1 and plate electrodes 25 formed within the second memory region MR2 are physically and electrically spaced apart from each other. In addition, one end portions of the plate electrodes 25 formed within the first memory region MR1, which are adjacent to the second slit region S2_R, have a wave pattern due to the first holes H1. One end portions of the plate electrodes 25 formed within the second memory region MR2, which are adjacent to the second slit region S2_R, have a wave pattern due to the first holes H1. The one end portions of the plate electrodes 25 formed within the first memory region MR1 and the one end portions of the plate electrodes 25 formed within the second memory region MR2 have wave patterns which face each other and are symmetrical to each other.

The first holes H1 connected to each other, which are formed within the second slit region S2_R, may be defined as the second slit S2 shown in FIG. 3 or 4. The second slit in accordance with the another embodiment of the present disclosure may have a structure in which a plurality of first holes H1 disposed in a plurality of lines are connected to each other, and a surface of the second slit, which is adjacent to the first memory region MR1, and a surface of the second slit, which is adjacent to the second memory region MR2, may have wave patterns which are symmetrical to each other.

FIG. 14C is a plan view of a layer (C-C') in which the interlayer insulating layer shown in FIG. 14A is disposed. Referring to FIG. 14C, the interlayer insulating layers 11 formed within the second slit region S2_R are not etched in a process of etching the above-described plate electrodes 25 to a certain thickness, and therefore, the first holes H1 penetrating the interlayer insulating layers 11 may be disposed to be spaced apart from each other at a certain distance.

Figure 15:
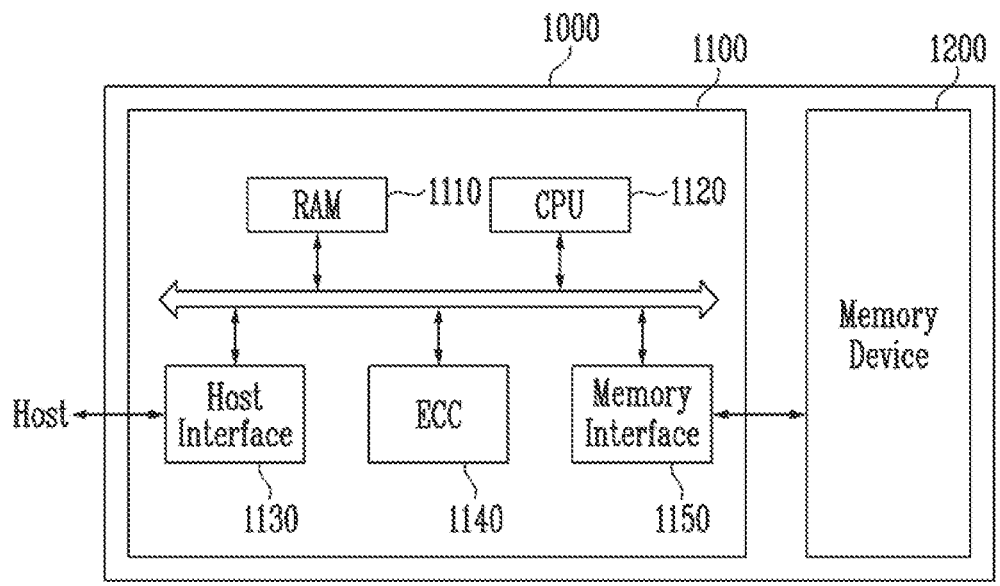
FIG. 15 is a block diagram illustrating a configuration of a memory system in accordance with an embodiment of the present disclosure.

FIG. 15 is a block diagram illustrating a configuration of a memory system in accordance with an embodiment of the present disclosure.

Referring to FIG. 15, the memory system 1000 in accordance with an embodiment of the present disclosure includes a memory device 1200 and a controller 1100.

The memory device 1200 is used to store data information having various data formats such as texts, graphics, and software codes. The memory device 1200 may be a non-volatile memory, and be manufactured according to the manufacturing methods of the memory devices described with reference to FIGS. 6, 7A, 7B, 8, 9A, 9B, 10, 11, 12A, 12B, 12C, 13A, and 13B or the manufacturing methods of the memory devices described with reference to FIGS. 14A, 14B, and 14C. A structure and a manufacturing method of the memory device 1200 are the same as described above, and therefore, detailed descriptions will be omitted.

The controller 1100 is connected to a host and the memory device 1200, and accesses the memory device 1200 in response to a request from the host. For example, the controller 1100 controls reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 controls overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer system interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with an embodiment of the present disclosure includes the memory device 1200 having an improved degree of integration and improved characteristics, and thus the degree of integration and characteristics of the memory system 1000 can be improved.

Figure 16:
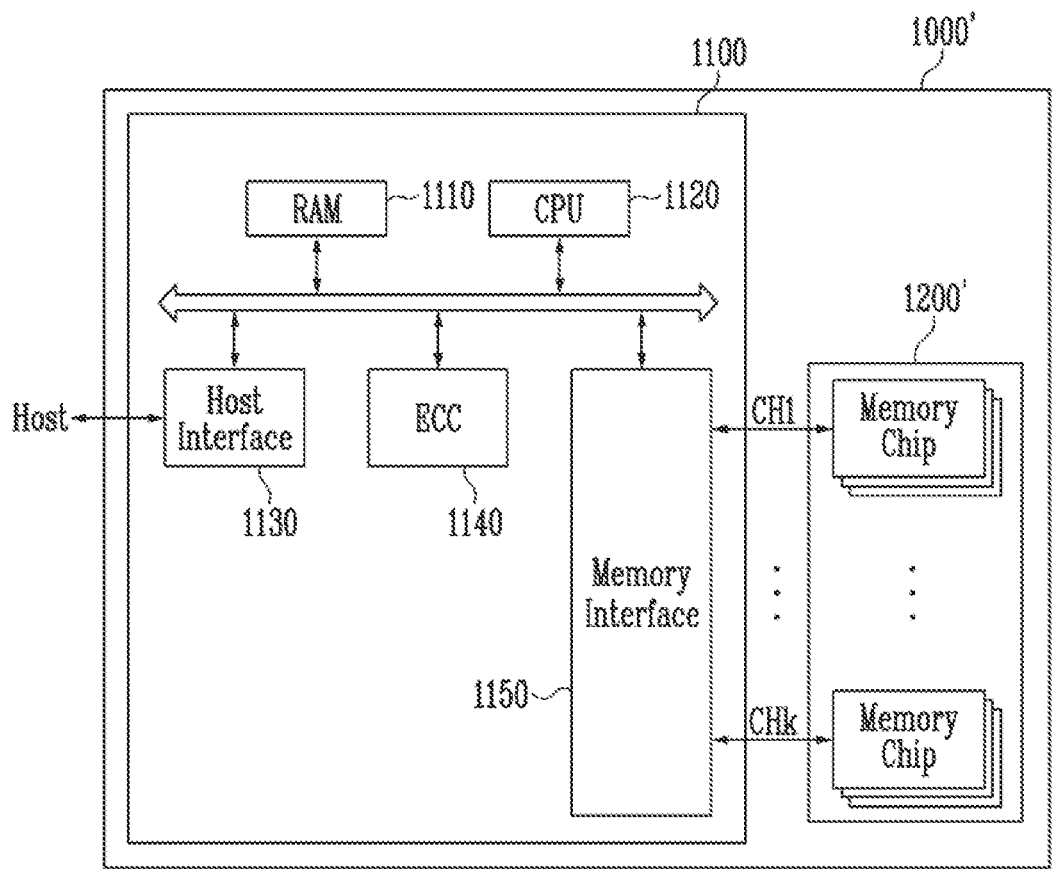
FIG. 16 is a block diagram illustrating a configuration of a memory system in accordance with an embodiment of the present disclosure.

FIG. 16 is a block diagram illustrating a configuration of a memory system in accordance with an embodiment of the present disclosure. Hereinafter, descriptions of portions overlapping with those described above will be omitted.

Referring to FIG. 16, the memory system 1000' in accordance with an embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory, and be manufactured according to the manufacturing methods of the memory devices described with reference to FIGS. 6, 7A, 7B, 8, 9A, 9B, 10, 11, 12A, 12B, 12C, 13A, and 13B or the manufacturing methods of the memory devices described with reference to FIGS. 14A, 14B, and 14C. A structure and a manufacturing method of the memory device 1200' are the same as described above, and therefore, detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with an embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 17:
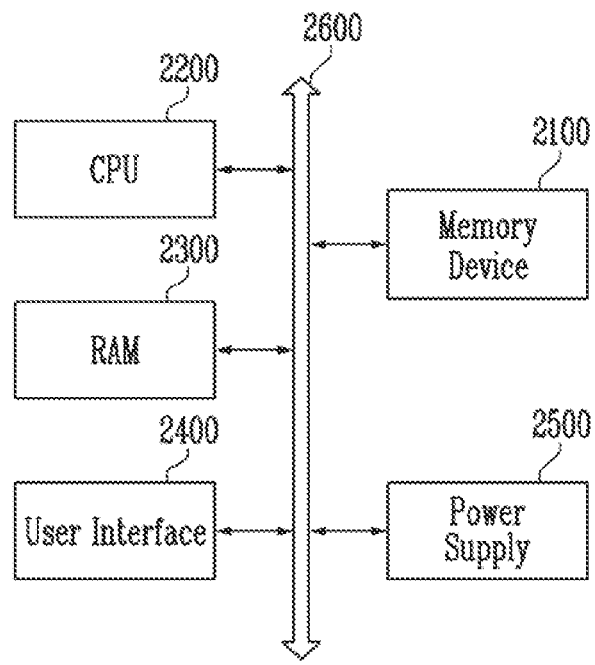
FIG. 17 is a block diagram illustrating a configuration of a computing system in accordance with an embodiment of the present disclosure.

FIG. 17 is a block diagram illustrating a configuration of a computing system in accordance with an embodiment of the present disclosure. Hereinafter, descriptions of portions overlapping with those described above will be omitted.

Referring to FIG. 17, the computing system 2000 in accordance with an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory, and be manufactured according to the manufacturing methods of the memory devices described with reference to FIGS. 6, 7A, 7B, 8, 9A, 9B, 10, 11, 12A, 12B, 12C, 13A, and 13B or the manufacturing methods of the memory devices described with reference to FIGS. 14A, 14B, and 14C. A structure and a manufacturing method of the memory device 2100 are the same as described above, and therefore, detailed descriptions will be omitted.

The memory device 2100 may be a multi-chip package including a plurality of memory chips as described with reference to FIG. 16.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player; a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with an embodiment of the present disclosure includes the memory device 2100 having an improved degree of integration and improved characteristics, and thus characteristics of the computing system 2000 can also be improved.

Figure 18:
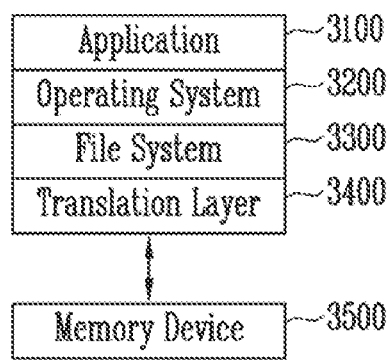
FIG. 18 is a block diagram illustrating a computing system in accordance with an embodiment of the present disclosure.

FIG. 18 is a block diagram illustrating a computing system in accordance with an embodiment of the present disclosure.

Referring to FIG. 18, the computing system 3000 in accordance with an embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and be manufactured according to the manufacturing methods of the memory devices described with reference to FIGS. 6, 7A, 7B, 8, 9A, 9B, 10, 11, 12A, 12B, 12C, 13A, and 13B or the manufacturing methods of the memory devices described with reference to FIGS. 14A, 14B, and 14C. A structure and a manufacturing method of the memory device 3500 are the same as described above, and therefore, detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with an embodiment of the present disclosure includes the memory device 3500 having an improved degree of integration and improved characteristics, and thus characteristics of the computing system 3000 can also be improved.

In accordance with the present disclosure, in a process of forming a slit which electrically isolates a first memory region and a second memory region from each other, gate electrodes of the first memory region and the second memory region can be isolated from each other by using a hole in a slit region, so that the process of forming the slit can be more easily performed. Further; any additional mask process for the process of forming the slit is not required, and thus a threshold numerical value of a cell plug adjacent to the slit can be uniformly formed.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
    a first gate stack structure and a second gate stack structure; and
    a slit disposed between the first gate stack structure and the second gate stack structure to electrically isolate the first gate stack structure and the second gate stack structure from each other,
    wherein the slit includes a plurality of first holes extending in a vertical direction, and side portions of the plurality of first holes are connected to side portions of neighboring first holes.

2. The memory device of claim 1,
    wherein, in the slit, the plurality of first holes are arranged in a line to be connected to each other, or the plurality of first holes are arranged in a zigzag shape to be connected to each other.

3. The memory device of claim 1,
    wherein the first gate stack structure is formed within a first memory region, the second gate stack structure is formed within a second memory region, and the slit is formed within a slit region, and
    wherein the slit region is disposed between the first memory region and the second memory region.

4. The memory device of claim 3,
wherein the first gate stack structure and the second gate stack structure include a plurality of plate electrodes and a plurality of interlayer insulating layers, which are alternately stacked.

5. The memory device of claim 4,
wherein the plurality of first holes electrically and physically isolate the plurality of plate electrodes of the first gate stack structure and the plurality of plate electrodes of the second gate stack structure from each other within the slit region.

6. The memory device of claim 4,
wherein the plurality of interlayer insulating layers of the first gate stack structure and the plurality of interlayer insulating layers of the second gate stack structure extend into the slit region to be connected to each other, and
wherein the plurality of first holes penetrate the plurality of interlayer insulating layers of the first gate stack structure and the plurality of interlayer insulating layers of the second gate stack structure within the slit region.

7. The memory device of claim 4,
wherein one end portions of the plate electrodes of the first gate stack structure, which are adjacent to the slit, have a first wave pattern.

8. The memory device of claim 7,
wherein one end portions of the plate electrodes of the second gate stack structure, which are adjacent to the slit, have a second wave pattern.

9. The memory device of claim 8,
wherein the first wave pattern and the second wave pattern are substantially symmetrical to each other.

10. The memory device of claim 1, wherein each of the first gate stack structure and the second gate stack structure includes cell plugs extending in the vertical direction.

11. The memory device of claim 1, further comprising a source line contact formed at the inside of the slit.

\* \* \* \* \*